(12) United States Patent
Narayan (10) Patent No.: US 6,955,985 B2
(45) Date of Patent: Oct. 18, 2005

(54) DOMAIN EPITAXY FOR THIN FILM GROWTH

(75) Inventor: Jagdish Narayan, Raleigh, NC (US)

(73) Assignee: Kopin Corporation, Taunton, MA (US)

( * ) Notice: Subject to any disclaimer, the term of this patent is extended or adjusted under 35 U.S.C. 154(b) by 80 days.

(21) Appl. No.: 10/608,780

(22) Filed: Jun. 27, 2003

(65) Prior Publication Data

US 2004/0072381 A1 Apr. 15, 2004

Related U.S. Application Data

(60) Provisional application No. 60/479,206, filed on Jun. 17, 2003, and provisional application No. 60/393,008, filed on Jun. 28, 2002.

(51) Int. Cl.[7] ............................................... H01L 21/44
(52) U.S. Cl. ...................................... 438/681; 438/680
(58) Field of Search ................................ 438/681, 680, 438/660, 663, 743, 744, 752, 753, 754, 756, 757, 933, 954

(56) References Cited

U.S. PATENT DOCUMENTS

| | | |
|---|---|---|
| 4,153,905 A | 5/1979 | Charmakadze et al. |
| 4,495,514 A | 1/1985 | Lawrence et al. |
| 4,625,182 A | 11/1986 | Bovino et al. |
| 4,670,088 A | 6/1987 | Tsaur et al. |
| 4,946,548 A | 8/1990 | Kotaki et al. |
| 4,966,862 A | 10/1990 | Edmond |
| 5,091,333 A | 2/1992 | Fan et al. |
| 5,210,051 A | 5/1993 | Carter, Jr. |
| 5,239,188 A | 8/1993 | Takeuchi et al. |
| 5,247,533 A | 9/1993 | Okazaki et al. |
| 5,252,499 A | 10/1993 | Rothschild |
| 5,272,108 A | 12/1993 | Kozawa |
| 5,278,433 A | 1/1994 | Manabe et al. |
| 5,281,830 A | 1/1994 | Kotaki et al. |
| 5,285,078 A | 2/1994 | Mimura et al. |
| 5,290,393 A | 3/1994 | Nakamura |
| 5,306,662 A | 4/1994 | Nakamura et al. |
| 5,323,022 A | 6/1994 | Glass et al. |
| 5,334,277 A | 8/1994 | Nakamura |
| 5,369,289 A | 11/1994 | Tamaki et al. |
| 5,383,088 A | 1/1995 | Chapple-Sokol et al. |
| 5,385,862 A | 1/1995 | Moustakas |
| 5,406,123 A | 4/1995 | Narayan |
| 5,408,120 A | 4/1995 | Manabe et al. |
| 5,433,169 A | 7/1995 | Nakamura |
| 5,442,205 A * | 8/1995 | Brasen et al. ................ 257/191 |
| 5,455,195 A | 10/1995 | Ramsey et al. |
| 5,468,678 A | 11/1995 | Nakamura et al. |

(Continued)

FOREIGN PATENT DOCUMENTS

| | | |
|---|---|---|
| DE | 24 21 590 A | 11/1975 |
| DE | 33 45 172 A1 | 7/1985 |

(Continued)

OTHER PUBLICATIONS

Chichibu, S., et al., "Exciton Localization in InGaN Quantum Well Devices," *J. Vac. Sci. Technol B.*, vol. 16(4):2204–2214 (1998).

(Continued)

*Primary Examiner*—David Nhu
(74) *Attorney, Agent, or Firm*—Hamilton, Brook, Smith & Reynolds, P.C.

(57) ABSTRACT

A method of forming an epitaxial film on a substrate includes growing an initial layer of a film on a substrate at a temperature $T_{growth}$, said initial layer having a thickness h and annealing the initial layer of the film at a temperature $T_{anneal}$, thereby relaxing the initial layer, wherein said thickness h of the initial layer of the film is greater than a critical thickness $h_c$. The method further includes growing additional layers of the epitaxial film on the initial layer subsequent to annealing. In some embodiments, the method further includes growing a layer of the film that includes at least one amorphous island.

15 Claims, 7 Drawing Sheets

U.S. PATENT DOCUMENTS

| | | | |
|---|---|---|---|
| 5,516,731 A | | 5/1996 | Toutounchi et al. |
| 5,563,422 A | | 10/1996 | Nakamura et al. |
| 5,578,839 A | | 11/1996 | Nakamura et al. |
| 5,637,530 A | * | 6/1997 | Gaines et al. ............... 117/105 |
| 5,652,434 A | | 7/1997 | Nakamura et al. |
| 5,656,832 A | | 8/1997 | Ohba et al. |
| 5,686,738 A | | 11/1997 | Moustakas |
| 5,726,462 A | | 3/1998 | Spahn et al. |
| 5,733,796 A | | 3/1998 | Manabe et al. |
| 5,734,182 A | | 3/1998 | Nakamura et al. |
| 5,747,832 A | | 5/1998 | Nakamura et al. |
| 5,751,752 A | | 5/1998 | Shakuda |
| 5,760,423 A | | 6/1998 | Kamakura et al. |
| 5,767,581 A | | 6/1998 | Nakamura et al. |
| 5,777,350 A | | 7/1998 | Nakamura et al. |
| 5,828,684 A | | 10/1998 | Van de Walle |
| 5,834,326 A | | 11/1998 | Miyachi et al. |
| 5,834,331 A | | 11/1998 | Razeghi |
| 5,850,410 A | | 12/1998 | Kuramata |
| 5,877,558 A | | 3/1999 | Nakamura et al. |
| 5,880,486 A | | 3/1999 | Nakamura et al. |
| 5,900,650 A | | 5/1999 | Nitta |
| 5,905,276 A | | 5/1999 | Manabe et al. |
| 5,959,307 A | | 9/1999 | Nakamura et al. |
| 5,998,925 A | | 12/1999 | Shimizu et al. |
| 6,001,669 A | * | 12/1999 | Gaines et al. ............... 438/102 |
| 6,017,774 A | | 1/2000 | Yuasa et al. |
| 6,051,849 A | | 4/2000 | Davis et al. |
| 6,060,335 A | | 5/2000 | Rennie et al. |
| 6,066,861 A | | 5/2000 | Höhn et al. |
| 6,067,222 A | | 5/2000 | Hausmann |
| 6,069,440 A | | 5/2000 | Shimizu et al. |
| 6,078,063 A | | 6/2000 | Nakamura et al. |
| 6,084,899 A | | 7/2000 | Shakuda |
| 6,093,965 A | | 7/2000 | Nakamura et al. |
| 6,097,040 A | | 8/2000 | Morimoto et al. |
| 6,115,399 A | | 9/2000 | Shakuda |
| 6,118,801 A | | 9/2000 | Ishikawa et al. |
| 6,153,010 A | | 11/2000 | Kiyoku et al. |
| 6,153,894 A | | 11/2000 | Udagawa |
| 6,172,382 B1 | | 1/2001 | Nagahama et al. |
| 6,204,512 B1 | | 3/2001 | Nakamura et al. |
| 6,215,133 B1 | | 4/2001 | Nakamura et al. |
| 6,241,344 B1 | | 6/2001 | Machida |
| 6,245,259 B1 | | 6/2001 | Höhn et al. |
| 6,249,012 B1 | | 6/2001 | Manabe et al. |
| 6,255,129 B1 | | 7/2001 | Lin |
| 6,268,618 B1 | | 7/2001 | Miki et al. |
| 6,287,947 B1 | | 9/2001 | Ludowise et al. |
| 6,337,493 B1 | | 1/2002 | Tanizawa et al. |
| 6,344,665 B1 | | 2/2002 | Sung et al. |
| 6,362,017 B1 | | 3/2002 | Manabe et al. |
| 6,403,987 B1 | | 6/2002 | Miki et al. |
| 6,410,942 B1 | | 6/2002 | Thibeault et al. |
| 6,417,525 B1 | | 7/2002 | Hata |
| 6,445,127 B1 | | 9/2002 | Oku et al. |
| 6,475,854 B2 | | 11/2002 | Narwankar et al. |
| 6,495,862 B1 | | 12/2002 | Okazaki et al. |
| 6,521,999 B1 | | 2/2003 | Uemura et al. |
| 6,531,383 B1 | | 3/2003 | Lee |
| 2001/0022367 A1 | | 9/2001 | Nakamura et al. |
| 2001/0028062 A1 | | 10/2001 | Uemura et al. |
| 2001/0030318 A1 | | 10/2001 | Nakamura et al. |
| 2001/0032976 A1 | | 10/2001 | Ishikawa et al. |
| 2001/0050375 A1 | | 12/2001 | Van Dalen |
| 2002/0001864 A1 | | 1/2002 | Ishikawa et al. |
| 2002/0046693 A1 | | 4/2002 | Kiyoku et al. |
| 2002/0047128 A1 | | 4/2002 | Song et al. |
| 2002/0060326 A1 | | 5/2002 | Manabe et al. |
| 2002/0182765 A1 | | 12/2002 | Tran et al. |
| 2003/0160246 A1 | | 8/2003 | Narayan et al. |
| 2003/0199171 A1 | | 10/2003 | Rice et al. |
| 2003/0222263 A1 | | 12/2003 | Choi |
| 2004/0000670 A1 | | 1/2004 | Oh et al. |
| 2004/0000671 A1 | | 1/2004 | Oh et al. |
| 2004/0000672 A1 | | 1/2004 | Fan et al. |

FOREIGN PATENT DOCUMENTS

| | | |
|---|---|---|
| DE | 199 34 031 A | 5/2000 |
| DE | 199 11 717 A1 | 9/2000 |
| DE | 100 60 439 A | 6/2002 |
| EP | 0 356 059 A2 | 2/1990 |
| EP | 0 483 688 A2 | 5/1992 |
| EP | 0 483 688 B1 | 5/1992 |
| EP | 0 513 745 A2 | 11/1992 |
| EP | 622 858 A2 | 11/1994 |
| EP | 1 168 460 A2 | 1/2002 |
| JP | 52/028887 | 3/1977 |
| JP | 54-093380 | 7/1979 |
| JP | 59-228776 | 12/1984 |
| JP | 61-056474 | 3/1986 |
| JP | 02-229475 | 9/1990 |
| JP | 2229475 | 9/1990 |
| JP | 03-203388 | 9/1991 |
| JP | 03-218625 | 9/1991 |
| JP | 03-252177 | 11/1991 |
| JP | 04-068579 | 3/1992 |
| JP | 4209577 | 7/1992 |
| JP | 4236478 | 8/1992 |
| JP | 04-242985 | 8/1992 |
| JP | 05-243614 | 9/1993 |
| JP | 06-021511 | 1/1994 |
| JP | 06-177423 | 6/1994 |
| JP | 06-268259 | 9/1994 |
| JP | 8167735 | 6/1996 |
| JP | 8213692 | 8/1996 |
| JP | 8306643 | 11/1996 |
| JP | 8306958 | 11/1996 |
| JP | 8316527 | 11/1996 |
| JP | 9092880 | 4/1997 |
| JP | 9134881 | 5/1997 |
| JP | 9167857 | 6/1997 |
| JP | 11145513 | 5/1999 |
| JP | 2001 015811 A | 1/2001 |
| WO | WO 88/00392 | 1/1988 |
| WO | WO 01/47038 A1 | 6/2001 |
| WO | WO 01/73858 A1 | 10/2001 |
| WO | WO 02/09185 A1 | 1/2002 |

OTHER PUBLICATIONS

Chen, L., et al., "Fabrication of 50–100 nm Patterned InGaN Blue Light Emitting Heterostructures," *IEEE, 14th Annual Meeting of the IEEE Lasers & Electro–Optics Society,* 1:760–761 (2001).

Cho, H. K., et al., "Influence of Strain–Induced Indium Clustering on Characteristics of InGaN/GaN Multiple Quantum Wells with High Indium Composition," *Journal of Applied Physics,* 91(3):1104–1107 (2002).

Narayan, J. and H. Wang, "Effect of Thickness Variation in High–Efficiency InGaN/GaN Light–Emitting Diodes," *Applied Physics Letters,* 81(5): 841–843 (2002).

Kim, H., et al., "Design and Fabrication of Highly Efficient GaN–Based Light–Emitting Diodes," *IEEE Transactions on Electron Devices,* 49(10):1715–1722 (2002).

Maeda, T., et al., "Effects of NiO on Electrical Properties of NiAu–Based Ohmic Contacts for p–type GaN," *Applied Physics Letters* 75(26):4145–4147 (1999).

Foresi, J.S. and Moustakas, T.D., "Metal contacts to gallium nitride," *Appl. Phys. Lett.* 62(22):2859–2861 (1993).

Nakamura, S., "InGaN blue—light—emitting diodes," *Journal of the Institute of Electronics, Information and Communication Engineers* 76(9):913–917 (1993) (Abstract).

Akasaki, I. and Amano, H., "High efficiency UV and blue emitting devices prepared by MOVPE and low energy electron beam irradiation treatment;" *Physical Concepts of Materials for Novel Optoelectronic Device Applications,* 1361:138–149 (1990).

Amano, H., et al., "P–Type Conduction in Mg–Doped GaN Treated with Low–Energy Electron Beam Irradiation (LEEBI)", *Japanese Journal of Applied Physics* 28(12):L2112–L2114 (1989).

Andreev, V.M., et al., "Luminescence Properties of i–n, i–n–i and n–i–n Structures Made of Epitaxial Layers GaN/$\alpha$–Al$_2$O$_3$," *Journal of Luminescence* 35:9–16 (1986).

Boulou, M., et al., "Recombination Mechanisms in GaN:Zn," *Journal of Luminescence* 18/19:767–770 (1979).

Casey, Jr., H.C. and Panish, M.B., "SLAB–Dielectric Waveguides," in *Heterostructure Lasers,* (NY: Academic Press), pp. 32–35 (1978).

Goldenberg, B., et al., "Ultraviolet and violet light–emitting GaN diodes grown by low–pressure metalorganic chemical vapor deposition," *Appl. Phys. Lett.* 62(4):381–383 (1993).

F. Goodenough, "Exotic Semiconductors Showcased at the IEDM," *Electronic Design,* pp. 60, 62, 64–66, 68 (1994).

Hayashi, I., et al., "Junction Lasers Which Operate Continuously at Room Temperature," *Appl. Phys. Lett.* 17(3):109–111 (1970).

Jacob, G., et al., "GaN Electroluminescent Devices: Preparation and Studies," *Journal of Luminescence* 17:263–282 (1978).

Jang, J.–S., et al., "High Quality Non–Alloyed Pt Ohmic Contacts to P–Type GaN Using Two–Step Surface Treatment," *MRS Internet J. Nitride Semiconductor Res. F99W10.4.*

Kaminska, E., et al., "Ni/Si–Based Contacts to GaN: Thermally Activated Structural Transformations Leading to Ohmic Behavior," *MRS Internet J. Nitride Semicond. Res. 4S1, G9.9.*

Kampen, T.U. and Mönch, W., "Metal Contacts on a–GaN," *MRS Internet J. Nitride Semicond. Res.* 1(41).

Madar, R., "High Pressure Solution Growth of GaN$^+$," *Journal of Crystal Growth* 31:197–203 (1975).

Matsuoka, T., "Growth and Properties of a Wide–Gap Semiconductor InGaN," *Optoelectronics* 5(1):53–64 (1990).

T. Matsuoka, "Current status of GaN and related compounds as wide–gap semiconductors," *Journal of Crystal Growth* 124:433–438 (1992).

Nakamura, S., et al., "High–power InGaN/GaN double–heterostructure violet light emitting diodes," *Appl. Phys. Lett.* 62(19):2390–2392 (1993).

Nakamura, S., et al., "P–GaN/N–InGaN/N–GaN Double-Heterostructure Blue–Light–Emitting Diodes," *Jpn. J. Appl. Phys.* 32:L8–L11 (1993).

S. Nakamura, "Growth of In$_x$ Ga$_{(1-x)}$N compound semiconductor and high–power InGaN/AlGaN double heterostructure violet–light–emitting diodes," *Microelectronics Journal* 25:651–659 (1994).

Nakamura, S., et al., "High–Power GaN P–N Junction Blue–Light–Emitting Diodes," *Japanese Journal of Applied Physics* 30(12A):L1998–L2001 (1991).

Nakamura, S., "InGaN/AlGaN Double–Heterostructure Blue LEDs," *Mat. Res. Soc. Symp. Proc.* vol. 339:173–178 (1994).

Nakamura, S., et al., "Thermal Annealing Effects on P–Type Mg–Doped GaN Films," *Jpn. J. Appl. Phys.* 31:L139–L142 (1992).

Nakamura, S., "Zn–doped InGaN growth and InGaN/AlGaN double–heterostructure blue–light–emitting diodes," *Journal of Crystal Growth* 145:911–917 (1994).

Nakamura, S., et al., "High–brightness InGaN/AlGaN double–heterostructure blue–green–light–emitting diodes," *J. Appl. Phys.* 76(12):8189–8191 (1994).

Nakamura, S., et al., "Cd–Doped InGaN Films Grown on GaN Films," *Jpn. J. Appl. Phys.* 32:L338–L341 (1993).

Nakamura, S., "High–Power InGaN/AlGaN Double–Heterostructure Blue–Light–Emitting Diodes," *Int'l Electronic Devices Meeting* 94:567–570 (1994).

Piotrowska, A., et al., "Ohmic Contacts to III–V Compound Semiconductors: A Review of Fabrication Techniques," *Solid–State Electronics* 26(3):179–197 (1983).

Sporken, R., et al., "XPS study of Au/GaN and Pt/GaN contacts," *MRS Internet J. Nitride Semiconductor Res.* 2(23)(1997).

Venugopalan, H.S., et al., "Phase Formation and Morphology in Nickel and Nickel/Gold Contacts To Gallium Nitride," MRS Internet Journal Nitride Semiconductor Research (1997) <URL:http://nsr.mij.mrs.org/MRS/S97–D/4.10>.

Zhou, L., et al., "Characteristics of Ti/Pt/Au Ohmic Contacts on p–type GaN/Al$_x$Ga$_{1-x}$N Superlattices," *MRS Internet J. Nitride Semicond. Res. F99W10.3.*

Dovidenko, K., et al., "Aluminum nitride films on different orientations of sapphire and silicon," *J. Appl. Phys.* 79(5): 2439–2445, (1996).

Jain, S.C., et al., "Applied Physics Reviews/III—nitrides: Growth, characterization, and properties," *J. Appl. Phys.* 87(3): 965–1006, (2000).

Lin, Y.S., et al., "Dependence of composition fluctuation on indium content in InGaN/GaN multiple quantum wells," *Appl. Phys. Lett.,* 77(19): 2988–2990, (2000).

Narukawa, Y., et al., "Dimensionality of excitons in laser-diode structures composed in In$_x$Ga$_{1-x}$N multiple quantum wells," *Phys. Rev. B,* 59(15): 10283–10288, (1999).

Kawakami, Y., et al., "Dynamics of optical gain in In$_x$Ga$_{1-x}$N multi– quantum well–based laser diodes," *Appl. Phys. Lett.,* 77(14): 2151–2153, (2000).

Strite, S., and Morkoc, H., "GaN, AlN, and InN: A review," *J. Vac. Sci. Technol. B,* 10(4):1237–1266, (1992).

Hassan, K.M., et al., "Optical and structural studies of Ge nanocrystals embedded in AlN matrix fabricated by pulsed laser deposition," *Appl. Phys. Lett.,* 75(9): 1222–1224, (1999).

Teng, C.W., et al., "Quantum confinement of E$_1$ and E$_2$ transitions in Ge quantum dots embedded in an Al$_2$O$_3$ or an AlN matrix," *App. Phys. Lett.,* 76(1): 43–45, (2000).

Narukawa, Y., et al., "Role of self–formed InGaN quantum dots for exciton localization in the purple laser diode emitting at 420 nm," *Appl. Phys. Lett.,* 70(8): 981–983, (1997).

Nakamura, S., "The Roles of Structural Imperfections in InGaN–Based Blue Light–Emitting Diodes and Laser Diodes," *Science Magazine,* 1–14, [retrieved online Aug. 8, 2000]. Retrieved from the Internet <URL: http://www.science.org/cgi/content/full/281/5379/956>.

Chichibu, S., et al., "Spatially resolved cathodoluminescence spectra of InGaN quantum wells," *App. Phys. Lett.,* 71(16): 2346–2348, (1997).

Queisser, H.J., et al., "Defects in Semiconductors: Some Fatal, Some Vital," *Science,* 281:945–950 (1998).

LeGoues, F. K., et al., "Cyclic Growth of Strain–Relaxed Islands," *Physical Review Letters,* 73(2):300–303 (1994).

Mahajan, S., "Defects in Semiconductors and Their Effects on Devices," *Acta Materialia,* 48:137–149 (2000).

Matthews, J.W., et al., "Defects in Epitaxial Multilayers," *Journal of Crystal Growth,* 27:118–125 (1974).

Narayan, J., et al., "Mechanism of Formation of 60° and 90° Misfit Dislocations in Semiconductor Heterostructures," *Materials Science and Engineering,* B10:261–267 (1991).

Narayan, J., et al., "Epitaxial Growth of TiN Films on (100) Silicon Susbtrates by Laser Physical Vapor Deposition," *Applied Physics Letters,* 61(11):1290–1293 (1992).

Matthews, J.W., "Coherent Interfaces and Misfit Dislocations," In *Epitaxial Growth Part B,* (Academic Press New York) Ch. 8, pp. 560–609 (1975).

* cited by examiner

Defects in PLD ZnO films

- *threading dis[locations]
  with b=1/3[1...]
  $10^7 cm^{-2}$*
- *stacking faul[ts]
  in basal plan[e]
  $10^5 cm^{-1}$*

*inversion domains*

FIG. 6B

DOMAIN EPITAXY FOR THIN FILM GROWTH

RELATED APPLICATIONS

This application claims the benefit of U.S. Provisional Application No. 60/393,008, filed on Jun. 28, 2002 and U.S. Provisional Application entitled DOMAIN EPITAXY FOR THIN FILM GROWTH, by Jagdish Narayan, filed on Jun. 17, 2003 under 60/479,206 The entire teachings of the above applications are incorporated herein by reference.

GOVERNMENT SUPPORT

The invention was supported, in whole or in part, by a grant from the National Science Foundation and by the U.S. Department of Energy under the Contract No. DE-AC05-00OR22725 and Contract No. W-31-109-ENG-38. The Government has certain rights in the invention.

INCORPORATION BY REFERENCE

The entire teachings of the following are incorporated herein by reference: U.S. application Ser. No. 10/463,219 filed on Jun. 17, 20002; U.S. Provisional Application No. 60/393,008, filed on Jun. 28, 2002; U.S. Provisional Application No. 60/389,750, filed on Jun. 17, 2002; U.S. patent application Ser. No. 10/187,466, filed on Jun. 28, 2002; U.S. patent application Ser. No. 10/187,465, filed on Jun. 28, 2002; U.S. patent application Ser. No. 10/187,468, filed on Jun. 28, 2002; U.S. Pat. No. 5,406,123.

BACKGROUND OF THE INVENTION

Epitaxial growth of thin films and control of defects in thin film heterostructures are key considerations for the next-generation microelectronic, optical and magnetic devices (H. J. Queisser and E. E. Haller, *Science* (1998) 281: 945, S. Nakamura, *Science* (1998) 281: 956, S. Mahajan, *Acta Mater.* (2000) 48: 137). As device feature sizes are getting smaller, a single dislocation is liable to control the device performance. In the well-established lattice-matching-epitaxy, where lattice misfit is small (i.e. less than 78%) the film grows pseudomorphically up to a certain thickness (critical thickness) before it becomes energetically favorable for the film to contain dislocations (J. W. Mathews and A. E. Blakeslee, *J. Crystal Growth* (1974) 27: 188, J. W. Mathews in "Epitaxial Growth", Part B, *Materials Science Series* (1975) 560, Academic Press, New York). In this case, the dislocations are generated at the surface and then they glide to the interface. The Burgers vectors and planes of the dislocations are dictated by the slip vectors and glide planes of the crystal structure of the film (J. Narayan and S. Sharan, *Mat. Sci. Engineering* B (1991) 10: 261). On the other hand, if the dislocations are generated at the edge of islands during three-dimensional growth, the geometrical constraints determine the Burgers vectors of the dislocations, which lie in the film-substrate interface. For example, during three-dimensional growth of germanium on silicon, it was found that 90° dislocations with a/2<110> Burgers vectors were created at the edge of germanium islands lying in the (001) film-substrate interface (F. K. LeGoues et al. *Phys Rev. Lett.* (1994) 73: 300). It is believed that the lattice matching epitaxy during thin film growth is possible as long as the lattice misfit between the film and the substrate is less than 7–8%. Smaller lattice misfit leads to smaller interfacial energy and coherent epitaxy is formed. Above this misfit the film generally will grow in a textured or largely polycrystalline manner. Such films contain plane boundaries. Plain boundaries consist of dislocation, which impede charge carrier movement and thus deleteriously affect the performance of semiconductor devices.

Accordingly, there is a need for electronic and semiconductor devices where a single crystal thin film layer of arbitrary crystal structure is epitaxially grown on top of a pre-selected substrate and where a lattice misfit between the epitaxial layer and the substrate is arbitrarily large.

SUMMARY OF THE INVENTION

In general, the instant invention relates to domain-matched epitaxial growth of a film on top of a substrate, whereby the integral multiples of lattice planes match across the film-substrate interface.

The method of the invention includes forming an epitaxial film on a substrate by growing an initial layer of a film on a substrate at a temperature $T_{growth}$, said initial layer having a thickness h. The initial layer of the film is then annealed at a temperature $T_{anneal}$, thereby relaxing the initial layer.

The advantages of the present invention include, for example, the ability to design and grow essentially strain-free epitaxial films on a substrate having arbitrarily large lattice misfit. Additional strain beyond perfect domain matching is relieved by a systematic (periodic) variation in domain size resulting in relieving most of strain within a couple of monolayers of the epitaxial material, so that the rest of the film can be grown free from lattice strains and the attending defects.

DETAILED DESCRIPTION OF THE INVENTION

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

It has now been discovered that a new technique allows epitaxial growth of films with any lattice misfit on a given substrates with atomically clean surfaces.

As used herein the term "lattice misfit," also referred to as "unrelaxed misfit strain," is defined as $\epsilon_c = a_f/a_s - 1$, where $a_f$ and $a_s$ are lattice constants of the film and the substrate, respectively.

As used herein, the term "epitaxy" refers to a process in which a thin layer, referred to as a "film," of a single crystal material is deposited on a single crystal substrate in such a manner that the crystallographic structure of the substrate is reproduced in the growing film. The term "heteroepitaxy" refers to an epitaxial growth wherein chemical composition of an "epi" material, i.e. a film, is different from the chemical composition of the substrate. Epitaxy can be achieved by any of the methods known in the art. Such methods include pulsed laser deposition (PLD), chemical vapor deposition (CVD), metal-organic vapor deposition (MOCVD), and molecular beam epitaxy (MBE).

In PLD, high-power pulsed laser beams are used to ablate the target in a vacuum (less than about $10^{-6}$ torr) or a controlled atmosphere. This produces a film of the same composition as the target.

In CVD, epitaxial growth is implemented by means of chemical reaction of a gas-phase epi material with an exposed solid substrate. The MOCVD is a similar procedure commonly used when the epi material is a III-V semiconductor. MBE, is a method of epitaxial growth wherein physical deposition of the epi material is carried out in ultra-high vacuum (at about 10-8 torr) and at the substrate temperatures not exceeding about 800° C. In MBE, an stream (a beam) of the molecules of the epi material is directed at a chemically clean substrate surface.

As used herein, the term "domain" refers to a portion of an interface between a substrate and an epitaxially grown layer comprising a whole number "n" of lattice planes on the substrate side of the interface, said planes having a separation distance "$d_s$" and a whole number "m" of lattice planes on the epitaxial layer side of the interface, said planes having a separation distance "$d_f$" and wherein the distances between the maximally separated planes within the portion of the interface on either side is about equal. As used herein, the term "domain-matching" refers to a step of forming at least one domain as defined above in a process of growing an epitaxial layer on a substrate.

As used herein, the term "critical thickness" refers to a thickness of a film, such that it becomes energetically favorable for the film to contain dislocations if the thickness of the film is above the critical thickness.

As used herein, the term "relaxation" refers to orienting the components (asymmetric units such as atoms or molecules) of a material of a film so that said orientation is energetically most favorable. Relaxation is measured by a degree of difference between the experimentally measured lattice constant of a material and the equilibrium value of the lattice constant. As used herein, the term "complete relaxation" refers to a state of a material wherein the lattice constant of the material is equal to the equilibrium lattice constant of this material.

According to the method of the present invention, the integral multiples of lattice planes match across the film-substrate interface, and the size of the domain equals the integral multiples of planar spacing. Furthermore, the size of the domain can be varied periodically to accommodate the lattice misfit that is not accommodated by perfect matching.

Without being limited to any particular theory, it is believed that the theoretical basis of the invention is as follows.

Fundamental Considerations in Domain-Matched Epitaxy

In domain matching epitaxy (DME), matching of lattice planes is considered, which could be different in different directions of the film-substrate interface. In the DME framework, the crystal structure of the film can have either the same or different orientation relationship with the substrate, depending on the nature of the misfit. The misfit is accommodated by matching of integral multiples of lattice planes, and there is one extra half-plane (dislocation) corresponding to each domain. The misfit can range from being very small to very large. In a case of relatively small misfit, the DME reduces to the conventional lattice matching epitaxy (LME), where matching of the same planes or lattice constants is considered with a misfit typically less that about 7–8%. If the misfit falls in between the perfect matching ratios of planes, then the size of the domain can vary in a systematic (periodic) way to accommodate the additional misfit. In LME, the unrelaxed misfit strain $\epsilon_c$ is less than 7 to 8% and is relaxed by the introduction of dislocations beyond the critical thickness during thin film growth. In DME, the matching of lattice planes of the film (separated by distance $d_f$) with the those of the substrate (separated by distance $d_s$) with similar crystal symmetry is considered. In DME, the film and the substrate planes could be quite different as long as they maintain the crystal symmetry. The LME, on the other hand, involves the matching of the same planes between the film and the substrate. In DME, the initial misfit strain ($\epsilon = d_f/d_s - 1$) could be very large, but can be relaxed by matching of m planes of the film with n of the substrate. This matching of integral multiples of lattice planes leaves a residual strain of $\epsilon_r$ given by $$\epsilon_r = (md_f/nd_s - 1) \tag{1}$$

where m and n are integers. In the case of a perfect matching $$md_f = nd_s,$$

and the residual strain $\epsilon_r$ is zero. If $\epsilon_r$ is finite, then two domains may alternate with a certain frequency to provide for a perfect matching according to, $$(m+\alpha)d_f = (n+\alpha)d_s \quad (2)$$

where $\alpha$ is a frequency factor. For example, if $\alpha=0.5$, then m/n and (m+1)/(n+1) domains alternate with equal frequency.

Assuming $d_f > d_s$, we have n>m. Therefore, $$n-m=1 \text{ or } f(m) \quad (3).$$

The difference between n and m could be 1 or some function of m, corresponding to the lowest energy of the system.

From equations (1) through (3), thye following equation can be derived, $$(m+\alpha)\epsilon = 1 \text{ or } f(m) \quad (4).$$

Figure 1:
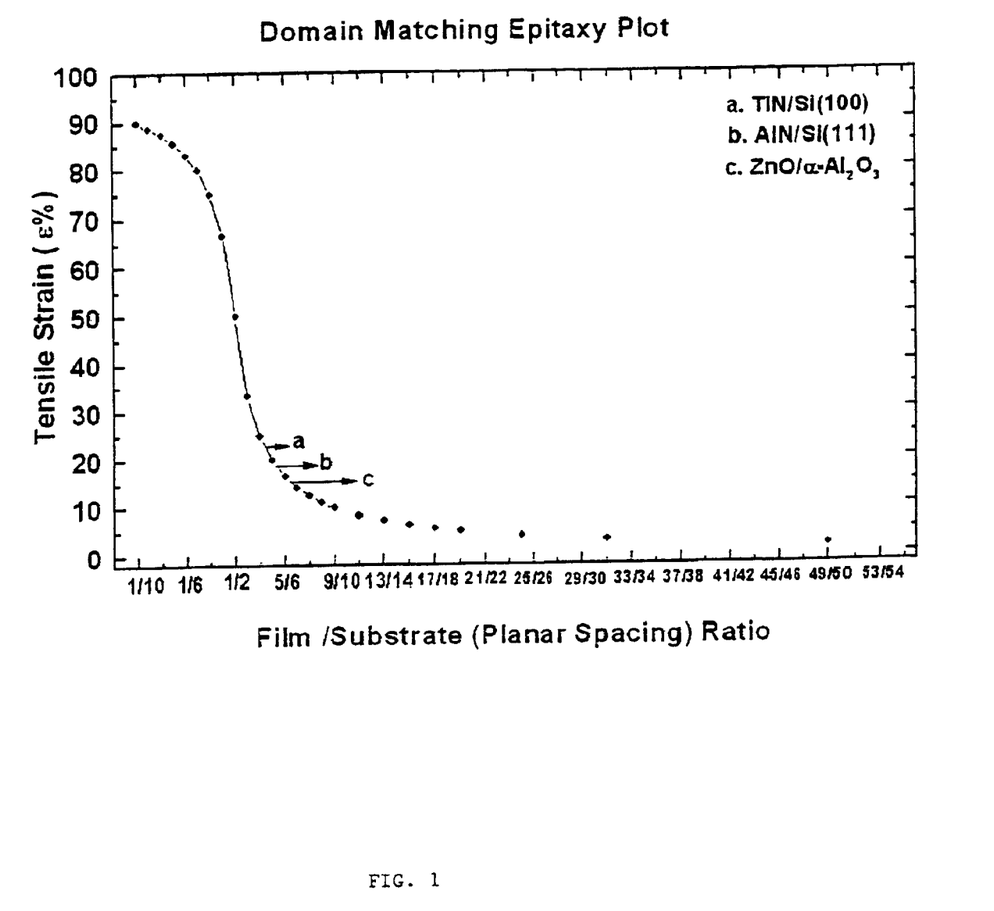
FIG. 1 is a plot of strain (lattice misfit) versus film-substrate planar spacing ratio. The LME region is above about 12/13 ratio or below about 7.7% strain. The plot can be used to predict the planar spacing ratio and domain periodicity of an epitaxial layer grown according to the method of the present invention.

Equation (4) governs the domain epitaxy. FIG. 1 shows a general plot of misfit percent strain as a function of ratio of film/substrate lattice constants of major planes matching across the interface. In FIG. 1, n−m=1 for $\epsilon$=0–50% and n−m=$f(m)$ for $\epsilon$=50 to 100%.

Table I provides a summary of different systems, which have been grown with various misfit strains. Table I also includes the systems, which fall in between the two domains, where two domains alternate with periodicity needed for a essentially complete relaxation.

TABLE I

Domain Epitaxy for Thin Film Growth

| m/n | Planar spacing ratio | Experimental Examples | Strain $\epsilon$ % |
|---|---|---|---|
| 1/10 | 0.1 | | 90.0% |
| 1/9 | 0.11 | | 88.8% |
| 1/8 | 0.125 | | 87.5% |
| 1/7 | 0.143 | | 85.7% |
| 1/6 | 0.166 | | 83.3% |
| 1/5 | 0.20 | | 80.0% |
| 1/4 | 0.25 | | 75.0% |
| 1/3 | 0.33 | | 66.7% |
| 1/2 and 1/3 | 0.33–0.50 | Mo, Nb, Ta, W/Si; Ni$_3$Al/Si(100) | 50.0% |
| 1/2 | 0.50 | Fe/Si, Cr/Si, NiAl/Si(100) | |
| 2/3 | 0.666 | Cu/Si(100) | 33.33% |
| 1/√2 | 0.707 | SrTiO3/Ge(100) | 29.28% |
| 3/4 | 0.750 | TiN/Si(100) | 25.00% |
| 4/5 | 0.80 | AlN/Si(111) | 20.00% |
| 5/6 | 0.83 | $\alpha$-Al$_2$O$_3$/ZnO(0001), | 16.67% |
| 6/7 | 0.857 | $\alpha$-Al$_2$O$_3$/ZnO(0001), Cu/TiN(100) | 14.29% |
| 7/8 | 0.8750 | $\alpha$-Al$_2$O$_3$/GaN(0001) | 12.50% |
| 8/9 | 0.888 | $\alpha$-Al$_2$O$_3$/AlN(0001) | 11.11% |
| 9/10 | 0.90 | Y$_{123}$/MgO(001) | 10.0% |
| 11/12 | 0.9166 | Y$_{123}$/MgO(001) | 8.33% |
| 12/13 | 0.9230 | STO/MgO(001) | 7.69% |
| 13/14 | 0.3286 | | 7.14% |
| 14/15 | 0.9333 | | 6.67% |
| 16/17 | 0.9412 | | 5.88% |
| 17/18 | 0.9444 | | 5.55% |
| 18/19 | 0.9474 | | 5.26% |
| 19/20 | 0.9500 | | 5.00% |
| 20/21 | 0.9524 | | 4.76% |
| 22/23 | 0.9556 | | 4.35% |
| 24/25 | 0.96 | Ge/Si(100) | 4.0% |
| 31/32 | 0.9687 | | 3.13% |
| 49/50 | 0.98 | Ge—Si/Si(100) | 2.0% |

It should be noted that a 45° rotation in some cubic systems and a 30° rotation in certain hexagonal systems are part of the domain-matching concept involving the matching of major planes between the film and the substrate. The plot in FIG. 1 provides a unified view of lattice-matching and domain-matching epitaxy with misfit strain ranging from 2–90% (50% corresponding to ½ matching). If the domain matching is not perfect, epitaxy occurs by accommodating the additional misfit by changing the domain size, controlled by the parameter $\alpha$. In this framework, it is important to realize that the nature of dislocations remains the same, only their periodicity changes.

Lattice Relaxation and Defect Reduction

The rapid relaxation process of DME is consistent with the fact that the critical thickness under relatively large misfits is less than 1 monolayer. As a result, dislocations can nucleate during initial stages of growth and confine most of the defects near the interface, leaving fewer defects near an active region of a device.

Since the critical thickness at which it becomes energetically feasible for the film to contain dislocations is less than one monolayer, the dislocations nucleate at free-surface steps within 1 monolayer and locate at the interface where there is an energy minimum. An important consideration here is a large number density of surface steps within the monolayer, which can provide easy nucleation sites for dislocations. If the initial growth is two-dimensional, the dislocations can propagate throughout the entire length of the film and confine themselves near the interface without creating threading dislocations. However, if the initial growth is a mixture of two-dimensional (2D) and three-dimensional (3D) growth, then dislocation segments may not propagate throughout the entire length and threading segments may form. Depending upon the nature of growth characteristics and the number density of surface steps, this consequence of DME can be used to reduce the number density of threading dislocations and confine most of the misfit dislocations near the interface.

However, if the critical thickness is relatively large in a low-misfit system, then the dislocations nucleate at the free-surface steps and then glide to the interface. The process creates a half-loop configuration with two threading segments and a straight segment along the interface. Since there is a nucleation barrier for the dislocation, misfit is not fully relaxed. In addition, threading segments do not expand to the edges due to the presence of other dislocations and obstacles, and as a result, a high density of these dislocations is retained within the film. Since these dislocations are purely glide or slip dislocations, their planes and Burgers vectors are controlled by the slip systems of the film. The relaxation process in low-misfit systems is gradual due to this nucleation barrier, leading to a large number of threading dislocations.

Preferred Embodiments of the Invention

Using the method of the present invention, films having larger misfits can be grown with fewer defects in the active region than generally occur by employment of conventional techniques.

In one embodiment, the present invention is a method of forming an epitaxial film on a substrate. The surface of the substrate preferably is atomically clean. Materials of a film and a substrate preferably have interatomic potentials that are not substantially different. Most preferably, the interatomic potentials do not differ by more than a factor of two. Materials of the film and of the substrate are further selected so that the symmetry of the crystal structures of two materials is similar. Examples of crystal structures with similar symmetries are two structures that have at least one symmetry element in common.

The method comprises the steps of growing an initial layer of a film on a substrate at a temperature $T_{growth}$, said initial layer having a thickness h, and annealing the initial layer of the film at a temperature $T_{anneal}$, thereby relaxing the initial layer. Preferably, the method further includes growing additional layers of the film. Most preferably, said thickness h of the initial layer of the film is greater than a critical thickness $h_c$.

As used herein, "$T_{growth}$" is a temperature sufficient to form an initial layer. As used herein, the term "annealing" refers to holding the initial layer without further deposition of film material at a temperature $T_{anneal}$ for a non-zero period of time. In one embodiment, the period of time during which the formed initial layer is annealed causes substantially complete relaxation of the crystal structure of the material of the initial layer. Preferably, the period of time during which the formed initial layer is annealed causes essentially complete relaxation of the crystal structure of the material of the initial layer. As used herein, "essentially complete relaxation" means that there is no detectable difference between an experimentally measured lattice constant and an equilibrium lattice constant.

As used herein, "$T_{anneal}$" is a temperature at which the formed initial layer is held without further depositing film material for a period of time sufficient to permit relaxation. In one embodiment, the period of time is sufficient to permit substantially complete relaxation. In another embodiment, the period of time is sufficient to permit essentially complete relaxation.

As used herein, "h" is a height of an initial layer formed during deposition of film material prior to annealing. The value of h can be measured either in Angstroms or in monolayers of atoms of the film.

Preferably, h is greater than $h_c$. Generally, h is between about 1 and about 10 monolayers. Preferably, h is between about 1 and about 5 monolayers.

Temperature $T_{growth}$ can be about equal to $T_{anneal}$ or $T_{growth}$ can be less than $T_{anneal}$. The time required for annealing is dependent on temperature $T_{anneal}$: the higher the annealing temperature, the less time is required for annealing. Preferably, $T_{growth}$ is between about 500° C. and 1000° C. More preferably, $T_{growth}$ is between about 500° C. and about 750° C. $T_{anneal}$ is preferably between about 500° C. and about 1000° C. More preferably, $T_{anneal}$ is between about 700° C. and 900° C.

Growth and annealing can independently be performed for a period of time from about 5 seconds to about 5 minutes. Preferably, growth and annealing can independently be performed for a period of time from about 1 minute to about 2 minutes.

The growth of the initial layer can be three-dimensional or two-dimensional. Two-dimensional growth is preferred.

In another embodiment, the method of the present invention further includes the step of growing a layer of the film that includes at least one area of amorphous growth. Areas, or "islands," of amorphous growth can generally be created by using either impurities (dopants) that exist in film material or by introduction of new or additional impurities. Many dislocations that would otherwise propagate beyond the initial layer of film subsequent to relaxation terminate at the islands. As used herein, "introduction of additional impurity" refers to increasing concentration of a dopant that is already present in the material of the film.

Preferably, suitable impurities exist in the material of the layer and, upon introduction of additional impurity, either alone or in combination with the material deposited as the film can form amorphous phase. Examples of suitable impurities are silicon and germanium. Silicone or germanium oxides and nitrides can form an amorphous phase. One of ordinary skill in the art can readily identify other suitable impurities. As a non-limiting example, a layer of a GaN film including at least one area of amorphous growth that includes silicon nitride or silicon oxide can be produced. After the initial layer is deposited and relaxed, the growth continues using MOCVD or pulsed laser deposition techniques, described below, until the film is about 1000 Å thick. Then, silane and ammonia, if MOCVD is employed, or silicon and nitrogen gas, if the pulsed laser deposition technique is employed, are used for $SiN_x$ formation, where x is between about 0.5 and about 1.33. The temperature for this process is from about 800° C. to about 1000° C. Alternatively, to form $SiO_y$, where y is between about 0.5 and about 2, silane and nitrous oxide ($N_2O$) at a temperature of from about 400° C. to about 500° C. are used.

The methods of the present invention generally can incorporate any of the epitaxy techniques known in the art. In a preferred embodiment, an apparatus as described in U.S. Pat. No. 5,406,123 is used. While, according to the present invention, overlayers, such as TiN, AlN on Si(100) and ZnO on α-$Al_2O_3$(0001), are preferably formed using pulsed laser deposition processes as described in J. Narayan et al., *Appl. Phys. Lett.* (1992) 61:1290, the entire teachings of which are herein incorporated by reference, it is to be understood that layers may be formed using various known processes including, but not limited to, molecular beam epitaxy (MBE), hydride vapor phase epitaxy (HVPE), magnetron sputtering techniques, and chemical vapor deposition (CVD).

The method of the present invention can be employed to produce components of various devices such as light-emitting diodes, laser diodes, UV detectors, and/or broad spectrum (e.g. white) light sources used, for example, in light bulbs. Microelectronic devices manufactured according to embodiments of the present invention can be transistors such as CMOS transistors, field-effect transistors, and/or bipolar transistors, diodes, field emitters, and/or power devices as well as other integrated circuit devices. Optoelectronic devices manufactured according to the method of the present invention can provide junctions between a substrate and a overlayer to provide LEDs, laser diodes, UV detectors, broad band light sources, and/or other optoelectronic devices. Junctions can be provided by doping and/or other techniques as will be understood by those skilled in the art.

EXEMPLIFICATION

Example 1

TiN film on Si(100) Substrate Accommodates a 22% Misfit

Epitaxial growth of TiN on silicon substrate represents a major milestone for next-generation semiconductor devices for direct ohmic contacts as well as for discussion barriers in copper metallization. However, with a misfit of over 22% for cube-on-cube TiN (a=0.424 nm) epitaxy over silicon (a=0.543 nm), it is beyond the critical strain (approximately 7–8%) of conventional lattice matching. However, epitaxial growth of TiN on silicon substrate was demonstrated by the concept of domain matching epitaxy. The films were grown using a standard pulsed laser deposition method known in the art. Briefly, the initial layer of TiN of thickness h about 1–2 monolayers was deposited at $T_{growth}$ of between about 600° C. and 650° C. and then annealed at $T_{anneal}$ of about 750° C. for about 1 to about 2 minutes. After annealing, the growth was resumed at $T_{growth}$.

Figure 2:
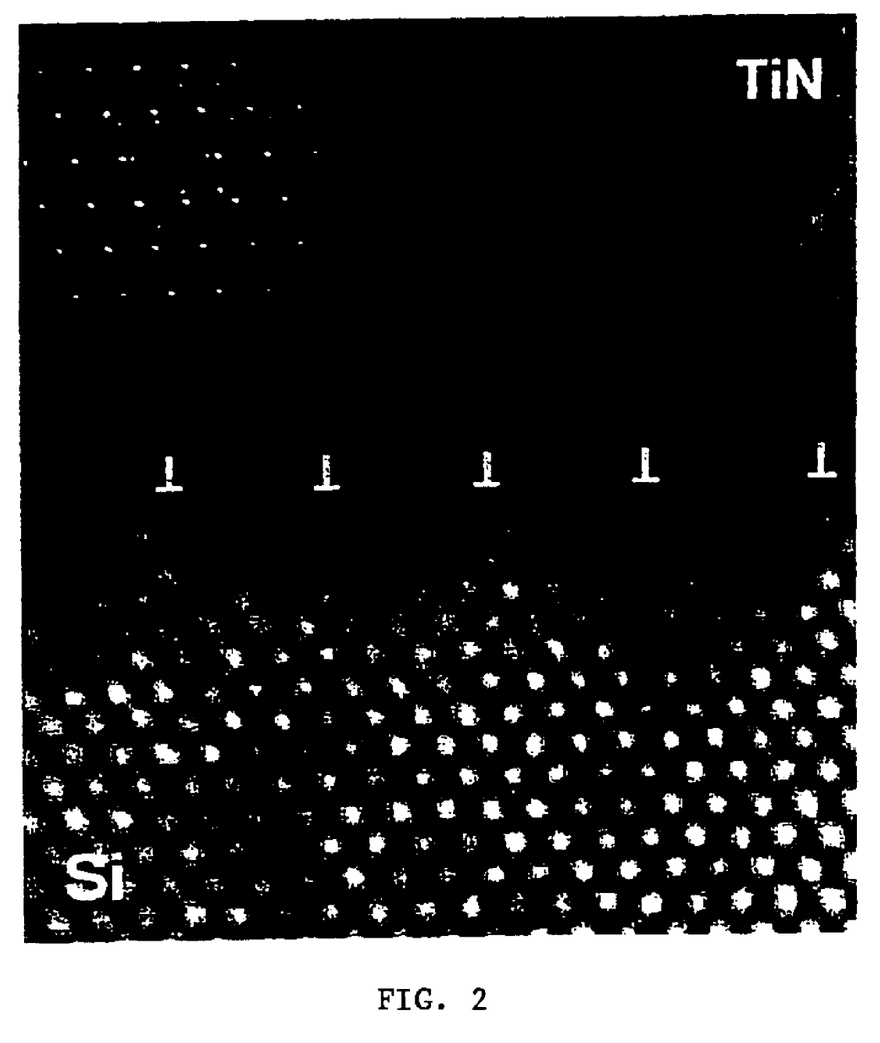
FIG. 2 is a high-resolution microphotograph of a cross-section in <110> direction from the TiN/Si(100) system grown according to the method of the presernt invention. The microphotograph shows domain matching of TiN with silicon. Here the frequency factor ($\alpha$=0.5) for 4/3 and 4/5 domains. The a/2<110> misfit dislocations lie in {111} planes in both TiN and silicon.

FIG. 2 shows a detailed high-resolution cross-section TEM micrograph, where the 3/4 and 4/5 domains alternate. The micrograph was taken in the <110> zone axis of Si and TiN, it is interesting to note the matching of {111} extra half planes in silicon as well as TiN. From FIG. 1, the lattice misfit of 22% lies in the middle 3/4 and 4/5 matching, which explains the alternating of domains. In fact with α=0.5 (see equation 2), $3.5a_{Si}=19.01$ matches quite well with $4.5 \times a_{TiN}=19.08$, which also represents the size of domain for the system with virtually no residual misfit.

The nature of dislocations can be established directly from the high-resolution TEM micrographs. The Burgers vector of the dislocations is determined to be a/2 <110> lying in {111} planes. The two sets of a/2<110> dislocations combine at the interface to produce a/2<110> dislocations lying in the {001} interface. This dislocation reaction can be described as: a/2[101](11-1)+a/2[01-1](111)→ a/2[110] (001). In some cases, the dislocations do not combine and create an extended core structure associated with the pair of dislocations. The formation of a/2<110> dislocations in {111} plane in TiN with a sodium chloride structure represents a significant finding. The TiN having a sodium chloride structure has {110} slip planes with a/2<110> Burgers vectors. Only under certain extreme nonequilibrium conditions such as high field, a/2<110> lying in {001} planes have been observed (18). However, this is first for a/2<110> dislocation in {111} planes of sodium chloride structure. These new dislocations or slip systems may impact mechanical and physical properties of TiN films or materials of sodium chloride structure, in general, in a significant way. According to von Mises criterion, five independent slip systems are needed for a crystal to undergo a plastic deformation by slip. In TiN having a sodium chloride structure, there are only two independent a/2<110>{110} slip systems available, which restricts a general deformation, resulting in twinning and fracture. However, with a/2<110>{111} slip systems, there are 384 ways of choosing five independent slip systems, which can lead to a general deformation of TiN (J. P. Hirth and J. Lothe, *Theory of Dislocations*, P. (1998) John Wiley, New York).

Example 2

Variations in Domain Size Accommodate a 20% Strain in III-Nitride Epitaxy on Si(111) System Epitaxial growth of III-nitrides having a wurtzite structure on silicon (111) substrates are needed as a template to grow GaInN and AlGaInN alloys as well as to integrate III-nitride based optoelectronic devices with microelectronic devices. Additionally, AlN has high thermal conductivity (320 w/MK), high thermal stability (up to 2200° C.), high resistivity ($10^{13}$Ω-cm), high dielectric strength (14 kV/cm), and high chemical inertness. The hardness and thermal expansion coefficient ($2.56 \times 10^{-6}$/K are comparable to that of silicon. The above properties make AlN an ideal candidate for application in microelectronic to optoelectronics including high-temperature devices and electronics packaging.

Epitaxial growth of AlN (0001) with hexagonal wurtzite structure (a=3.11 A, c=4.982A) on silicon (111) substrate occurs via matching of four silicon (220) planes with five (2$\bar{1}$10) planes of AlN. The spacing of (2$\bar{1}$10) AlN planes (a/2=1.556A) result is close to 19% strain with (220) planes of silicon. Using this strain, we found by using the plot in FIG. 1 that, 5 AlN (2$\bar{1}$10)/4 (220) matching results with less than 1% residual strain.

Using the standard pulsed laser deposition technique known in the art, we have grown an epitaxial film of AlN (0001) having a hexagonal wurtzite structure on silicon (111) substrate. Briefly, the initial layer of AlN of thickness h about 1–2 monolayers was deposited at $T_{growth}$ of about 650° C. and then annealed at $T_{anneal}$ of about 800° C. for about 1 to about 2 minutes. After annealing, the growth was resumed at $T_{growth}$.

Figure 3A:
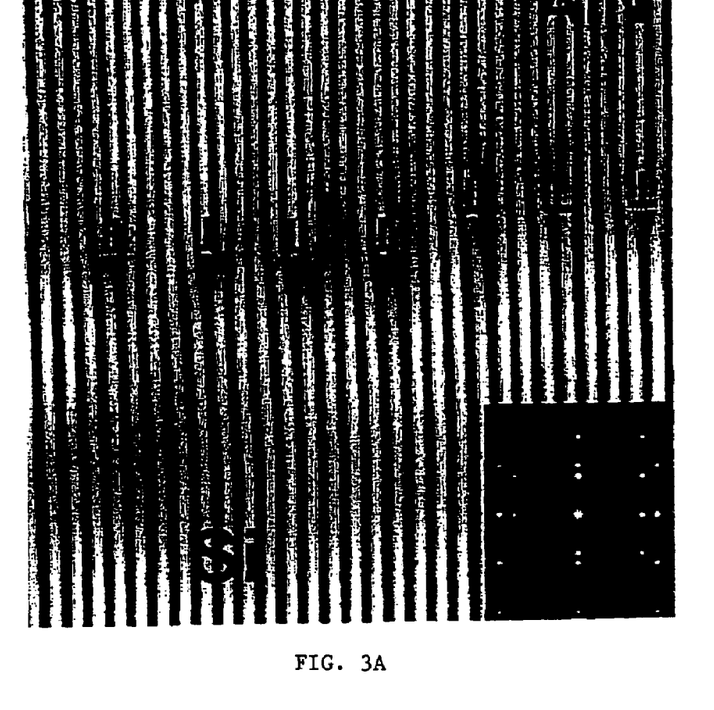
FIG. 3(a) is a microphotograph depicting domain epitaxy in AlN/Si(111) system, grown according to the method of the invention. The microphotograph of a high-resolution cross-section of a (01-10)AlN epitaxial layer and a (11-20)Si substrate is showing the matching of AlN($2\bar{1}\bar{1}0$) and Si(220) planes with $\alpha$=0.25 for 4/5 and 5/6 domains, while corresponding (inset) diffraction pattern shows the alignment AlN and Si planes.
Figure 3B:
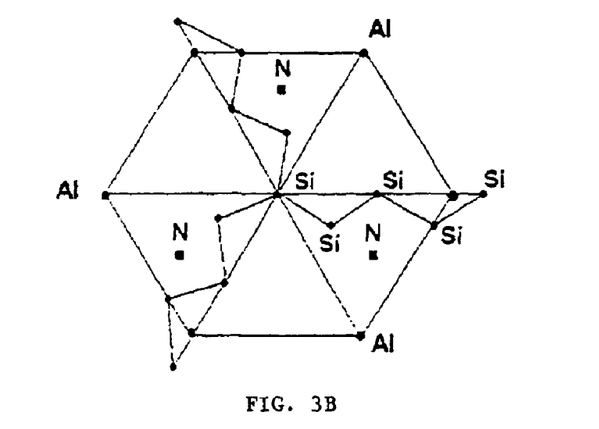
FIG. 3(b) is a schematic of arrangement of atoms in the basal plane of AlN and Si(111) system as grown by the method of the present invention.

FIG. 3(a) shows a cross-section TEM micrograph where the alignment of (2$\bar{1}$10) planes of AlN with (220) planes of silicon is clearly delineated. The (111) planes of silicon substrate are shown schematically in FIG. 3(b) on which basal planes of AlN {0001} grow with a-axis of AlN [2$\bar{1}$10] aligned with [220] direction of silicon. In this field of view, five planes of AlN clearly match with four planes of silicon with one exception where six planes of AlN match with 5 planes of silicon. This is predicted from our master diagram in FIG. 1 for a 19% strain. The perfect matching is predicted from equation (3) for α=0.25. Thus, the deviations from the ideal 5/4 matching (corresponding to 20% strain) are accommodated by variation in domain size, rather than an additional set of secondary dislocations to relieve the difference in the strain from the ideal 5/4 matching.

Example 3

Domain Epitaxy of Wurtzite Hexagonal ZnO on α-Al$_2$O$_3$(0001)

There is a growing interest in growing high quality thin films of ZnO and its alloys for light emitting diodes (LEDs) and laser diodes (LEDs) applications. The bandgap of ZnO can be tuned by alloying with MgO (8.0 eV, upshift) or with CdO (1.9 eV, downshift). The ZnO can be also used as a template for III-nitride growth separately as well as on sapphire substrates. Therefore, the growth of high quality ZnO (having wurtzite hexagonal structure, a=3.252 A, c=5.213 A) on a practical substrate such as sapphire (a=4.758 A, c=12.991 A) presents a major challenge. The growth of systems with such a relatively large misfit is possible only with domain matching epitaxy, where the misfit can be accommodated the matching of planes.

Using the standard pulsed laser deposition technique known in the art, we have grown an epitaxial film of ZnO having a hexagonal wurtzite structure on silicon (111) substrate. Briefly, the initial layer of ZnO of thickness h about 1–2 monolayers was deposited at $T_{growth}$ of about 650° C. and then annealed at $T_{anneal}$ of about 700° C. for about 1 to about 2 minutes. After annealing, the growth was resumed at $T_{growth}$.

Figure 4A:
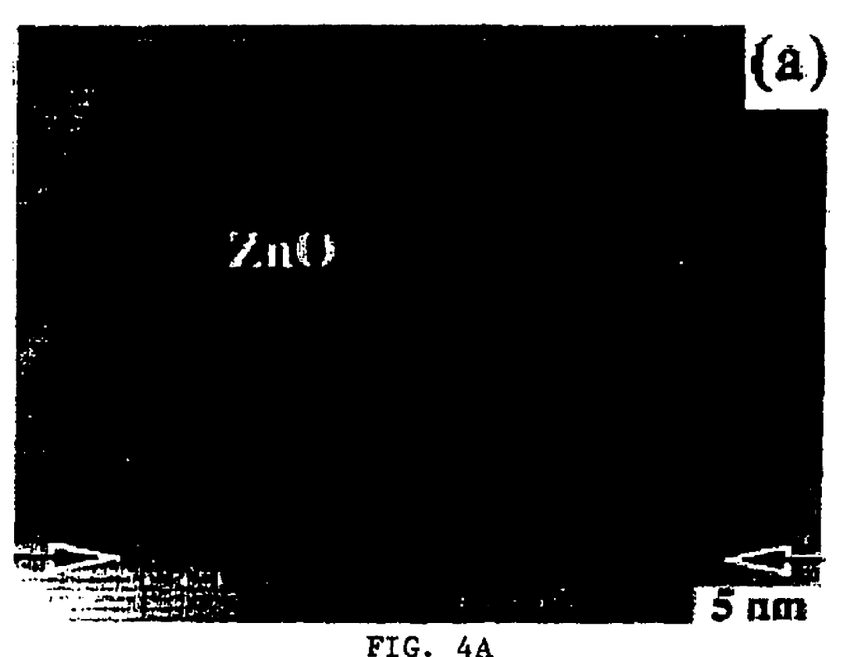
FIG. 4(a) is a high resolution TEM cross-section with (01-10) foil plane of sapphire and (2-1-10) plane of ZnO showing domain epitaxy in ZnO/ $\alpha Al_2O_3$(sapphire) system, grown according to the method of the present invention.
Figure 4B:
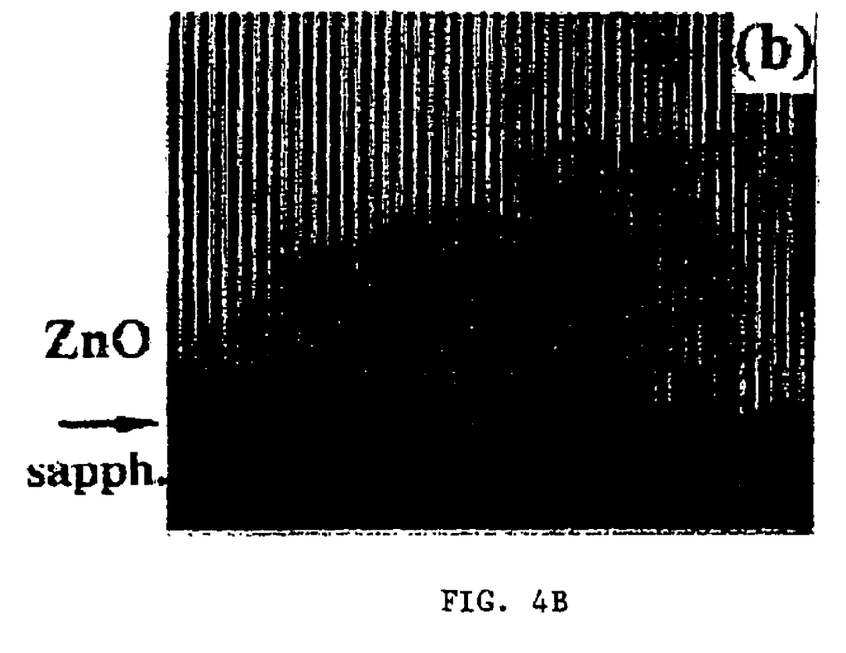
FIG. 4(b) is a Fourier-filtered image of a matching of (-2110) ZnO and (30$\bar{3}$0) sapphire planes of the system of FIG. 4(a) with the frequency factor ($\alpha$=0.5) for 5/6 and 6/7 domains.
Figure 4C:
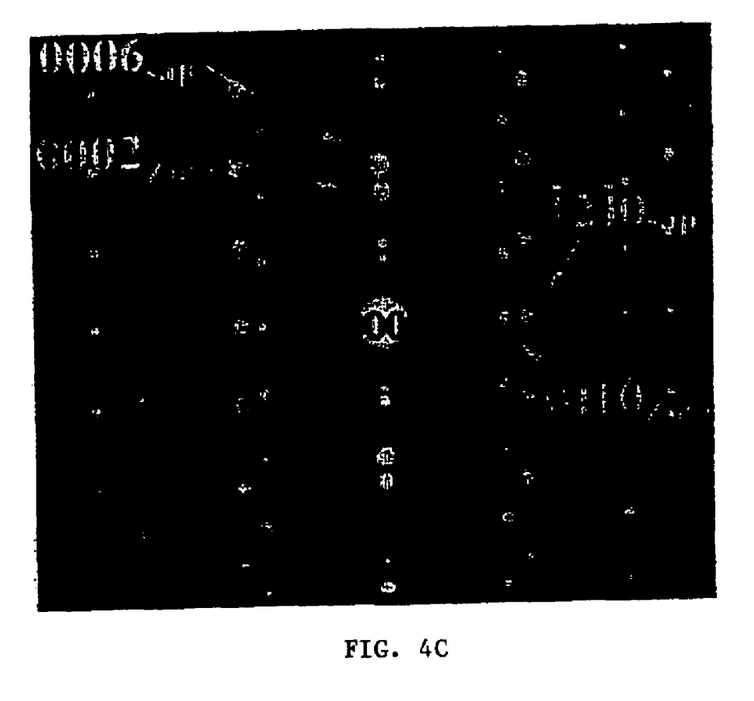
FIG. 4(c) is a photograph of an electron diffraction pattern corresponding to FIG. 4(a), showing the alignment of planes in ZnO and sapphire.
Figure 4D:
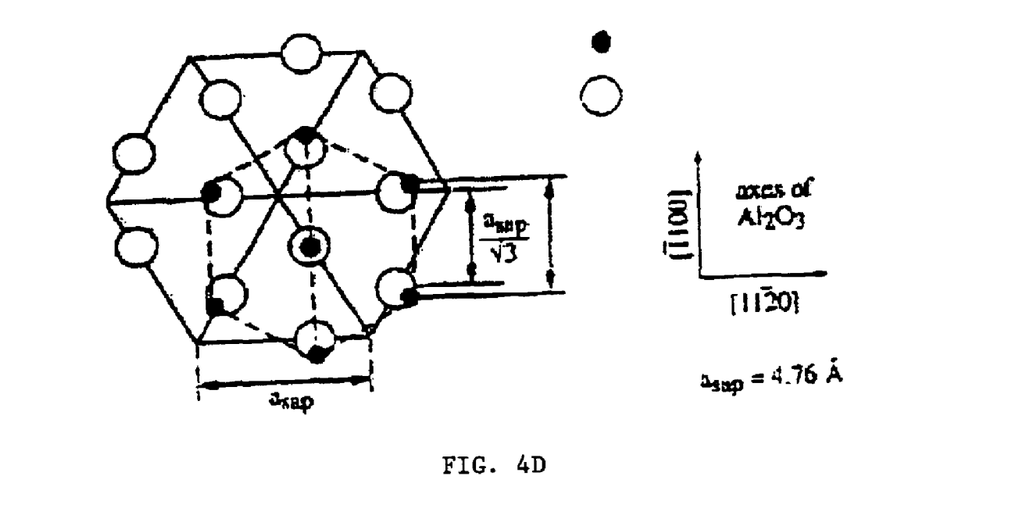
FIG. 4(d) is a schematic of arrangement of atoms in the basal plane of ZnO and sapphire of the system of FIG. 4(a).

FIG. 4(a) shows a high-resolution cross-section TEM micrograph where the ZnO film plane is (2-1-10) and the sapphire substrate is (01-10). The epitaxial growth of ZnO film with atomically sharp interface is clearly demonstrated. The Fourier-filtered image in FIG. 4(b) clearly delineates the matching of 5 or 6 (-2110) planes of ZnO with (30$\bar{3}$0) 6 or 7 planes of sapphire. The corresponding diffraction pattern, which confirms this alignment of planes, is shown in FIG. 4(c). The c-plane of ZnO rotates by 30° in the basal c-plane of sapphire as shown in FIG. 4(d), which leads to alignment of ½ (30$\bar{3}$0) planes of sapphire with (2$\bar{1}$10) planes or 'a' planes of the Zn0 film. Thus, we are looking at domain matching of sapphire planes (having $a_{sap}/\sqrt{3}$ spacing) with 'a' planes of ZnO. By alternating the domains, there is almost a perfect matching as $5.5 \times a_{ZnO}$ (3.2536)≈6.5 α-Al$_2$O$_3$ (2.7512), as predicted for α=0.5 from equation (3). These numbers include planar spacings at the growth temperature, taking into account the respective coefficients of thermal expansion. From the planar spacing, we calculate the strain of 15.44%, which falls in between 5/6 and 6/7 matching in the master plot of FIG. 1. This is in complete agreement with experimental observation of FIG. 4(a) and FIG. 4(b).

Example 4

In Situ X-Rae Diffraction Measurements Show Complete Relaxation After Deposition of Two Monolayers The critical thickness for this system is less than one monolayer. Two monolayers of ZnO were grown at 585 to 600° C. Annealing was performed either at 700° C. for about 10 minutes or 800° C. for about 1 minute. After annealing, the growth was resumed at 585 to 600° C.

The details of lattice relaxation process during initial stages of ZnO growth on sapphire (α-Al$_2$O$_3$, (0001)) substrates have been studied by in-situ x-ray diffraction study using the UNI-CAT undulator beam line at the Advanced Photon Source. In these experiments, the laser-ablation, filmgrowth chamber is mounted on a so-called 2+2 x-raydiffractometer where surface scattering measurements in specular and off-specular directions were made to investigate the details of initial stages of thin film growth. Time-slice x-ray crystal truncation rod (CTR) measurements made after each excimer laser ablation pulse revealed the surface structure transients associated with ZnO clustering and crystallization to last about 2 s following the abrupt ~5 μs duration of laser deposition.

Figure 5A:
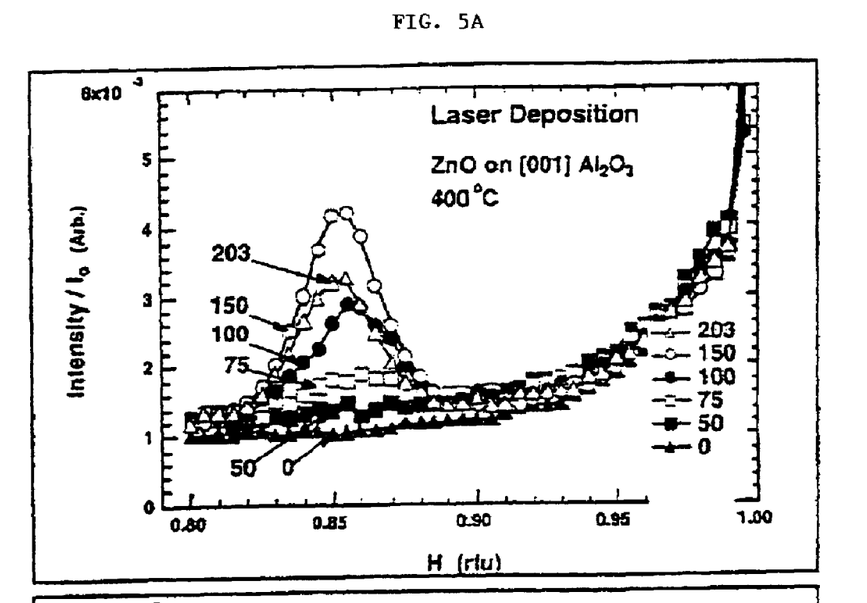
FIGS. 5(a) and (b) show X-ray surface diffraction measurements along the (H, 0, −H, 0.3) direction showing the growth according to the method of the present invention of ZnO films on sapphire with sapphire in-plane lattice parameter approaching H=0.845 corresponding to a fully relaxed position after a few monolayers.
Figure 5B:
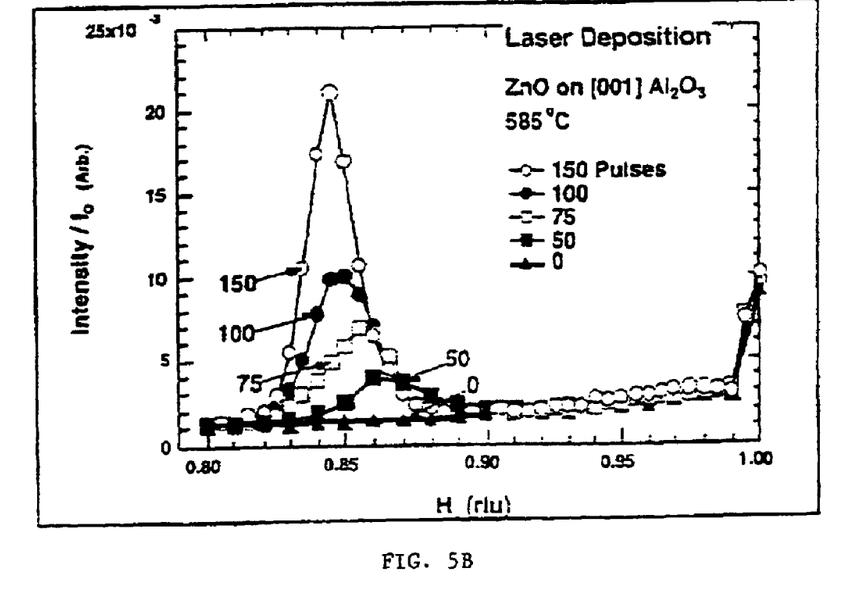

Specular CTR anti-Bragg measurements at the sapphire (0 0 5/2) position showed only one well-defined growth oscillation, indicating three-dimensional (3D) growth rather than layer by laser growth. Off-specular CTR measurements along the (H, 0, –H, 0.3) direction showed thermally activated relaxation of the 15.44% lattice mismatch between ZnO and Al$_2$O$_3$ along with a 30° in-plane rotation around the c axis. As shown in FIG. 5, a broad, nearly relaxed ZnO in-plane diffraction peak appears after the deposition of 3 monolayers at 400° C. (~25 pulses/monolayer), while a sharper and more fully relaxed ZnO peak appears after only 2 monolayers at 585° C. The peak after 150 pulses at 585° C. occurs at H=0.845 corresponding to the fully relaxed ZnO film. Subsequent measurements (not plotted here) showed that incommensuration occurs within the first layer of the deposition, and the nature of the strain is compressive as expected for matching of a planes of ZnO (spacing 3.2536 Å) with underlying sapphire planes (2.7512 Å). These results clearly established a rapid relaxation of ZnO films on sapphire. The relaxation process was found to be thermally activated because the ZnO thickness corresponding to complete relaxation decreased as the deposition temperature increased. The relaxation process requires the creation of dislocations, which involves nucleation and propagation of dislocations. Both of these steps are thermally activated. The nucleation barrier can be partially overcome by the surface steps, and the propagation is very small in DME due to the proximity of the interface.

Example 5

Dislocations are Confined to the Inteface in ZnO/Sapphire Specimens

Figure 6A:
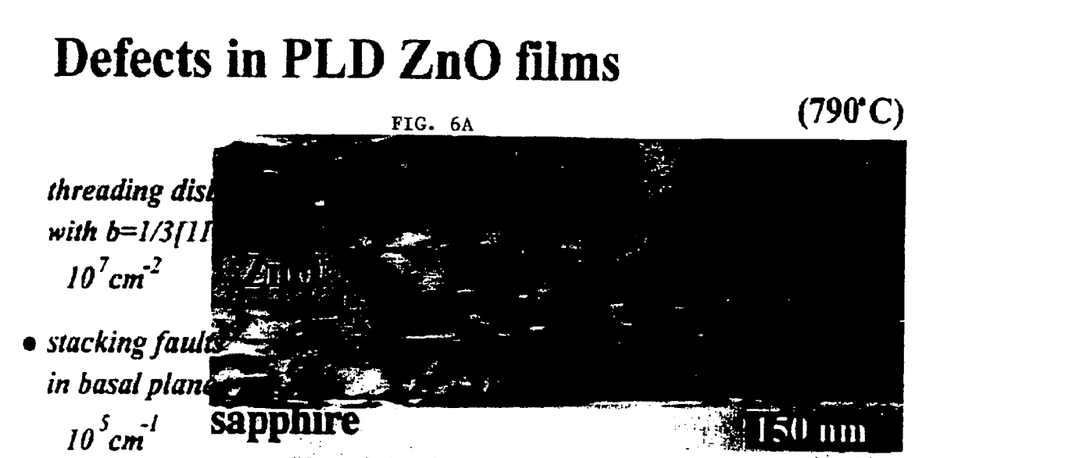
FIGS. 6(a) and (b) are cross-section TEM micrographs from ZnO/Sapphire specimens grown according to the method of the present invention under two different diffraction conditions (g vectors) showing low density of threading dislocations, stacking faults and domain boundaries. Most of the dislocations are confined to the interface.
Figure 6B:
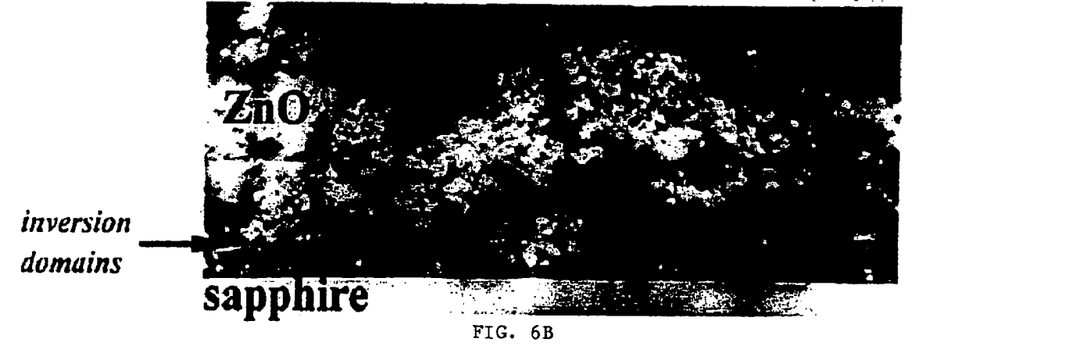

FIG. 6(a) and FIG. 6(b) show TEM cross-section of ZnO/Saphhire specimens, grown as described in Example 4, under two different diffraction conditions to image dislocations.

From these micrographs, the density of threading dislocations with Burgers vector b=1/3[11–20] was estimated to be $10^7$ cm$^{-2}$, which is three orders of magnitude lower than normally observed for the misfit of this magnitude (15.44%). The density of stacking faults (planar defects) was estimated to be $10^5$ cm$^{-1}$. It is interesting to note that most of the dislocations and other defects (stacking faults and domain boundaries) are confined to the ZnO/Sapphire interface as expected from domain epitaxy.

Equivalents

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of forming an epitaxial film on a substrate, comprising the steps of:

(a) growing an initial layer of a film on a substrate at a temperature $T_{growth}$, said initial layer having a thickness h;

(b) annealing the initial layer of the film at a temperature $T_{anneal}$, thereby substantially completely relaxing the initial layer.

2. The method of claim 1 further including growing additional layers of the film over the initial layer subsequent to annealing.

3. The method of claim 1 wherein said thickness h of the initial layer of the film is greater than a critical thickness $h_c$.

4. The method of claim 1 wherein h between about 1 and about 5 monolayers.

5. The method of claim 1 wherein $T_{growth}$ is about equal to $T_{anneal}$.

6. The method of claim 1 wherein $T_{growth}$ is less than $T_{anneal}$.

7. The method of claim 1 wherein growth of the initial layer includes two-dimensional growth.

8. The method of claim 1 wherein the substrate includes Si(100) and the film includes TiN.

9. The method of claim 1 wherein the substrate includes Si(111) and the film includes at least one III-nitride selected from the group consisting of AlN, GaInN, and AlGaInN.

10. The method of claim 9 wherein the film includes AlN.

11. The method of claim 1 wherein the substrate includes Al$_2$O$_3$(0001) and wherein the film includes at least one member selected from the group consisting of ZnO, AlN, GaInN, and AlGaInN.

12. The method of claim 11 wherein the film includes ZnO.

13. The method of claim 2 further including the step of growing a layer of the film that includes at least one amorphous area.

14. The method of claim 13 wherein at least one amorphous area includes Si.

15. The method of claim 14 wherein at least one area of amorphous growth includes silicon nitride or silicon oxide.

* * * * *